(12) United States Patent  (10) Patent No.: US 7,801,261 B2
Chakravarthy  (45) Date of Patent: Sep. 21, 2010

(54) CLOCK RECOVERY FROM DATA STREAMS CONTAINING EMBEDDED REFERENCE CLOCK VALUES

(75) Inventor: Kalyana Chakravarthy, Delhi (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 987 days.

(21) Appl. No.: 10/285,329

(22) Filed: Oct. 30, 2002

(65) Prior Publication Data

US 2003/0086518 A1 May 8, 2003

(30) Foreign Application Priority Data

Oct. 30, 2001 (IN) .................................. 1084/01

(51) Int. Cl.
*H03D 3/24* (2006.01)
(52) U.S. Cl. ...................... 375/376; 375/371; 375/373; 375/375; 327/141; 327/144; 327/146; 327/151; 327/159; 327/160; 327/162
(58) Field of Classification Search ................ 375/371, 375/373, 375, 376, 240.28; 327/141, 144, 327/146, 151, 159, 160, 162
See application file for complete search history.

(56) References Cited

U.S. PATENT DOCUMENTS

| 5,347,233 | A | * | 9/1994 | Ishibashi et al. ................ 331/2 |
| 5,473,385 | A | | 12/1995 | Leske |
| 5,661,765 | A | * | 8/1997 | Ishizu ........................ 375/376 |
| 5,714,896 | A | * | 2/1998 | Nakagawa et al. .......... 327/115 |
| 5,808,493 | A | * | 9/1998 | Akiyama et al. ............ 327/159 |
| 5,995,156 | A | * | 11/1999 | Han et al. .................... 348/500 |
| 6,072,369 | A | | 6/2000 | Dhong et al. |
| 6,141,394 | A | * | 10/2000 | Linebarger et al. .......... 375/376 |
| 6,175,385 | B1 | | 1/2001 | Kohiyama et al. |
| 6,192,074 | B1 | * | 2/2001 | Birks ......................... 375/240 |
| 6,549,456 | B2 | * | 4/2003 | Werner et al. .......... 365/185.03 |
| 6,674,805 | B1 | * | 1/2004 | Kovacevic et al. ..... 375/240.28 |
| 6,795,519 | B2 | | 9/2004 | Chakravarthy |
| 6,801,591 | B1 | * | 10/2004 | Frencken .................... 375/373 |
| 2001/0036240 | A1 | * | 11/2001 | Gossmann et al. .......... 375/376 |
| 2002/0033738 | A1 | * | 3/2002 | Saeki et al. .................... 331/17 |

FOREIGN PATENT DOCUMENTS

EP 0413473 A2 2/1991

OTHER PUBLICATIONS

Sato et al. "Digital Phase-Locked Loop with Wide Lock-In Range Using Fractional Divider" (1993) IEEE Pacific Rim Conference, Victoria, BC, Canada, May 19-21, 1993, pp. 431-434.
European Search Report, European Application No. EP 02 02 2752, dated Jun. 24, 2003.

* cited by examiner

*Primary Examiner*—Mohammad H Ghayour
*Assistant Examiner*—Leila Malek
(74) *Attorney, Agent, or Firm*—Lisa K. Jorgenson; Kevin D. Jablonski; Graybeal Jackson LLP

(57) ABSTRACT

A method and an improved apparatus for clock recovery from data streams containing embedded reference clock values controlled clock source includes of a controllable digital fractional divider receiving a control value from digital comparator and a clock input from a digital clock synthesizer driven by a fixed oscillator.

6 Claims, 3 Drawing Sheets

CLOCK RECOVERY FROM DATA STREAMS CONTAINING EMBEDDED REFERENCE CLOCK VALUES

PRIORITY

The present application claims the benefit of Indian Patent Application No. 1084/Del/2001, filed Oct. 30, 2001, entitled IMPROVED CLOCK RECOVERY FROM DATA STREAMS CONTAINING EMBEDDED REFERENCE CLOCK VALUES, which application is incorporated herein by reference in its entirety.

TECHNICAL FIELD

Embodiments of the present invention relate to a method and an improved apparatus for clock recovery from data streams containing embedded reference clock values that uses purely digital techniques and can be incorporated without major changes in most existing applications such as Motion Picture Expert Group (MPEG) based systems such as set-top boxes or DVD systems.

BACKGROUND OF THE INVENTION

Many applications involving streaming data, such as streaming video containing embedded reference-clock information to enable clock synchronization at the receiver. An important example of such data streams are Motion Picture Expert Group (MPEG) data streams that provide an efficient format for transmitting, receiving and storing video signals in digital format—the MPEG data stream format includes a timing reference field called Program Clock Reference (PCR) or Elementary Stream Clock Reference (ESCR) that is embedded during the encoding process and serves to provide a clock synchronizing source. The PCR/ESCR field is extracted during the receive or playback process and is used to synchronize the receiving clock with the data stream rate thereby implementing clock recovery. The synchronizing or clock recovery function is implemented by a Digital Phase Locked Lop (DPLL).

FIG. 1 shows a typical DPLL used in an MPEG receiver application. The MPEG encoding is performed using a reference 27 MHz clock. To facilitate the clock recovery process at the decoder, the MPEG streams are periodically (typically every 0.1 sec) embedded with a timing reference field called Program Clock Reference (PCR). The PCR is generated as follows.

The 27 MHz system clock is given to a counter. A snapshot of the counter is taken periodically (rate at which the PCR has to be sent). The values of the counter thus obtained are stuffed into the PCR field of the MPEG stream.

On the decoding side, the clock is recovered using the values in the PCR field.

The PCR in the MPEG stream is extracted and is stored in the received PCR register (1.1). The Local PCR register (1.2) stores the values of the PCR generated by the VCXO (1.6). The contents of the counter (1.4) are loaded into local PCR register, and the MPEG stream with the PCR field updates the contents of received PCR register (1.1). The comparator (1.3) outputs an error signal depending on the difference between received PCR (1.1) and the local PCR (1.2). The error signal is used to drive a controlled clock source (1.7). Within the controlled clock source (1.7) the error signal is converted into analog voltage by the D/A converter (1.5). The analog output voltage from D/A converter (1.5) biases the VCXO (1.6) to generate the required frequency. The actual implementation may have some blocks being implemented in software. For example, the compare function can be easily implemented in the software. The D/A block may consist of a PWM generator that is programmed by the software and a low pass filter.

U.S. Pat. No. 5,473,385 describes a DPLL apparatus in which a subtractor gives the difference between received and locally generated PCR values. The output of the subtractor, which is the error value, is fed to a digital filter connected to the input of an accumulator. The accumulated error values are processed by an error signal generator, which produces a frequency adjustment signal for advancing or retarding the local oscillator frequency after gating with a selected video synchronization signal so that the clock frequency correction is performed only during the vertical synch or blanking interval and the effects of the synchronization are not visible. This technique does not permit easy modification of the characteristics of the PLL as there are no programmable features. Also, the dropping of clocks during the vertical synch incurs a significant risk in obtaining jitter-free reading of data. Finally, the implementation of this method requires major redesign of MPEG decoder circuits used in existing systems such as set-top boxes.

U.S. Pat. No. 6,072,369 uses a phase error detector, interpolator, gain calculator, digital-to-analog converter (DAC), voltage controlled oscillator (VCO) divider, and local PCR (LPCR) counter to generate the local clock signal. This scheme is implemented purely in hardware and uses analog components such as the DAC and VCO. It is therefore sensitive to noise and its characteristics are not easily modifiable.

U.S. Pat. No. 6,175,385 describes three purely digital schemes that essentially use a fixed frequency oscillator. Clock synchronization is achieved by counting clock pulses of the fixed frequency signal and adjusting the unit for incrementing or decrementing the counted value to a predetermined value in a predetermined time according to the deviation of the fixed frequency from the reference frequency. The scheme requires a redesign of almost all the blocks used to process MPEG information in the majority of existing applications. Further, this process needs to be implemented during the video-blanking interval and hence is limited to applications where such an interval is available.

SUMMARY

An embodiment of the invention eliminates or reduces the severity of some of the above drawbacks by providing a completely digital implementation of the clock-recovery systems.

Another embodiment of the invention provides dynamically configurable loop-filter characteristics.

A further embodiment of the invention provides such an implementation where no major re design of the existing video information processing blocks is required.

Therefore, one embodiment of invention provides an improved apparatus for clock recovery from data streams containing embedded reference clock values comprising:

clock reference storage means for storing clock reference values received from the incoming data stream connected to, input of a digital comparator means, the second input of which is connected to, local clock (LC) storage means for storing locally generated clock values provided by a, counter means which receives a clock signal from a controlled clock source means controlled by the output of said digital comparator means, characterized in that said controlled clock source means includes a controllable digital Fractional Divider means receiving a control value from said digital comparator means and a clock input from a digital clock synthesizer means driven by a fixed oscillator means.

For example:

The input data stream is an MPEG data stream in which said embedded clock reference value is either the Program Clock Reference (PCR) value or Elementary Stream Clock Reference (ESCR) value.

The comparator means is implemented using a microcontroller.

The Digital Fractional Divider is any known Digital Fractional Divider.

The said Digital Fractional Divider is implemented as claimed in our application, U.S. application Ser. No. 10/269,838 to Chakravarthy, filed Oct. 10, 2002 and now issued as U.S. Pat. No. 6,795,519.

The gain of said comparator means is adjusted in accordance with changing input conditions.

The gain of said comparator is adjusted to a high value prior to obtaining a match between said local clock and said clock reference and reduced after obtaining said match.

Another embodiment of the invention is a method for enabling clock recovery from data streams containing embedded reference clock values, comprising the steps of:

storing the received reference clock values, generating a controlled local clock, comparing said received reference clock with said generated local clock;

adjusting said controlled local clock to match said received reference clock;

characterized in that said controlled local clock is generated by performing controlled fractional division on the output from a fixed clock source.

The above method may also include adjusting of the loop gain in accordance with changing input conditions, such as the loop gain is adjusted to a high value prior to lock-in and to a lower value after lock-in.

BRIEF DESCRIPTION OF THE DRAWINGS

Embodiments of the invention will now be described with reference to the accompanying drawings.

DETAILED DESCRIPTION

In the following detailed description of exemplary embodiments of the invention, reference is made to the accompanying drawings, which form a part hereof. The detailed description and the drawings illustrate specific exemplary embodiments by which the invention may be practiced. These embodiments are described in sufficient detail to enable those skilled in the art to practice the invention. It is understood that other embodiments may be utilized, and other changes may be made, without departing from the spirit or scope of the present invention. The following detailed description is therefore not to be taken in a limiting sense, and the scope of the present invention is defined by the appended claims. In some instances, well known methods, procedures, components, and circuits have not been described in detail so as not to obscure the present invention.

Figure 1:
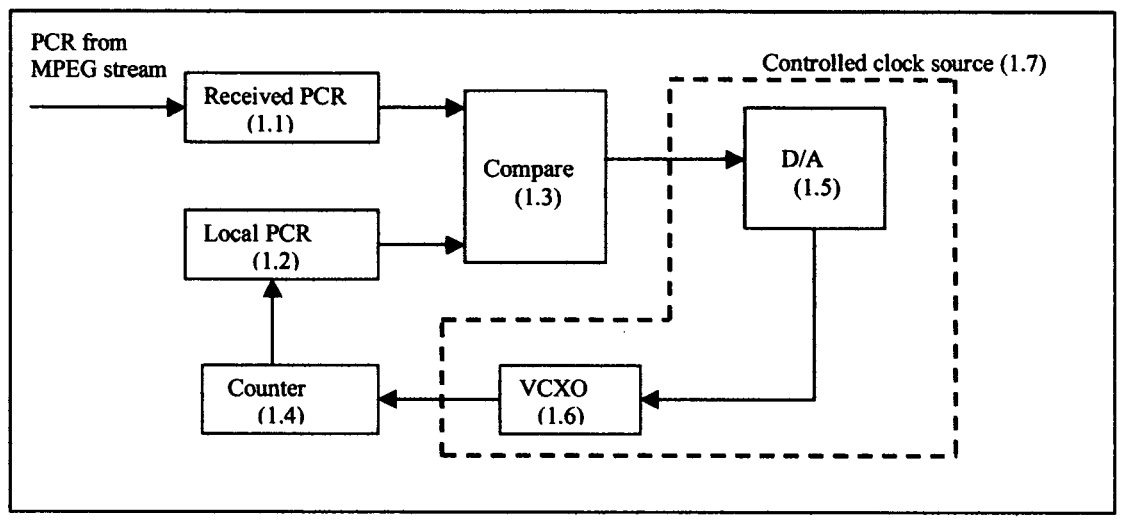
FIG. 1 shows a DPLL used in MPEG receiver application according to known art.

FIG. 1 is described in the Background.

Figure 2:
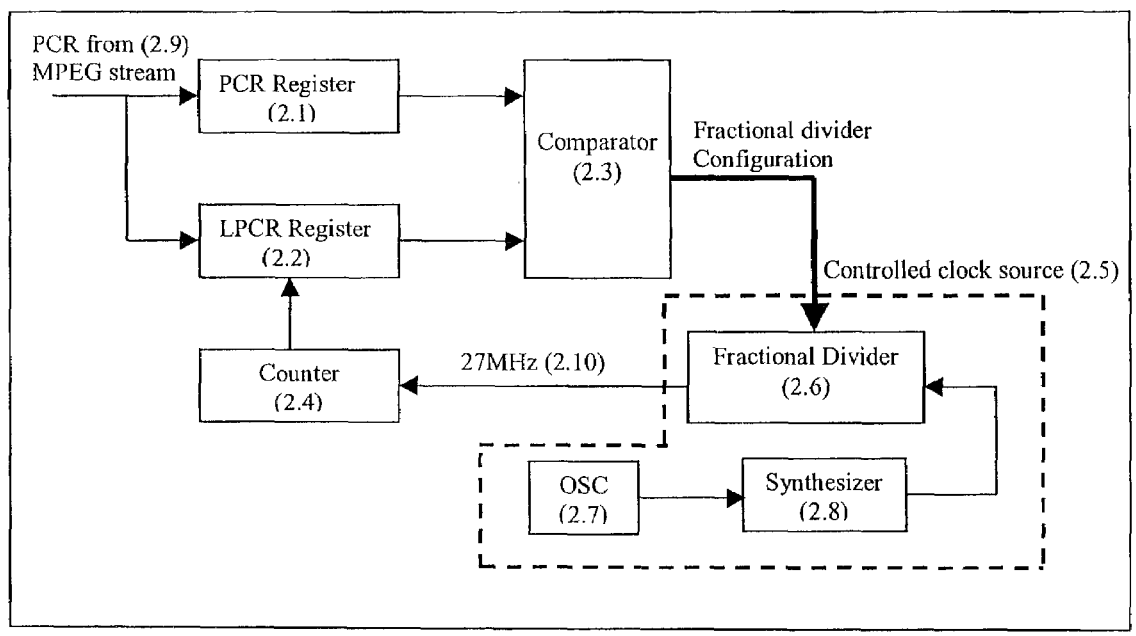
FIG. 2 shows a circuit diagram for a preferred embodiment of the invention.

FIG. 2 shows a preferred embodiment of the invention. The PCR/ESCR from the data stream is extracted and stored in the PCR register (2.1). The LPCR register (2.2) stores the values of the PCR generated by the controlled clock source (2.5). On receiving a data stream with PCR/ESCR field, the PCR register (2.1) and LPCR register (2.2) are updated by loading into them the contents of PCR/ESCR field and the counter (2.4) respectively. The comparator (2.3) is a logic circuit, which preferably includes a microcontroller for programmatically adjusting the loop gain in accordance with changing input conditions. In one embodiment, the loop gain is adjusted to a high value prior to obtaining a match between said local clock and said clock reference, and is reduced after obtaining said match. In another embodiment, the comparator (2.3) may be implemented with logic hardware.

The comparator (2.3) outputs a digital error signal depending upon the difference between PCR register (2.1) and LPCR register (2.2), which act as its inputs. The error signal may have both an integer part and a fractional part. The comparator logic circuit generates the error signal in a manner so as to minimize the difference between the received program clock reference (PCR) and the locally generated PCR (LPCR), thereby providing synchronization and enabling clock recovery. By doing so, the circuit as a whole functions as a digital phase locked loop.

Figure 3:
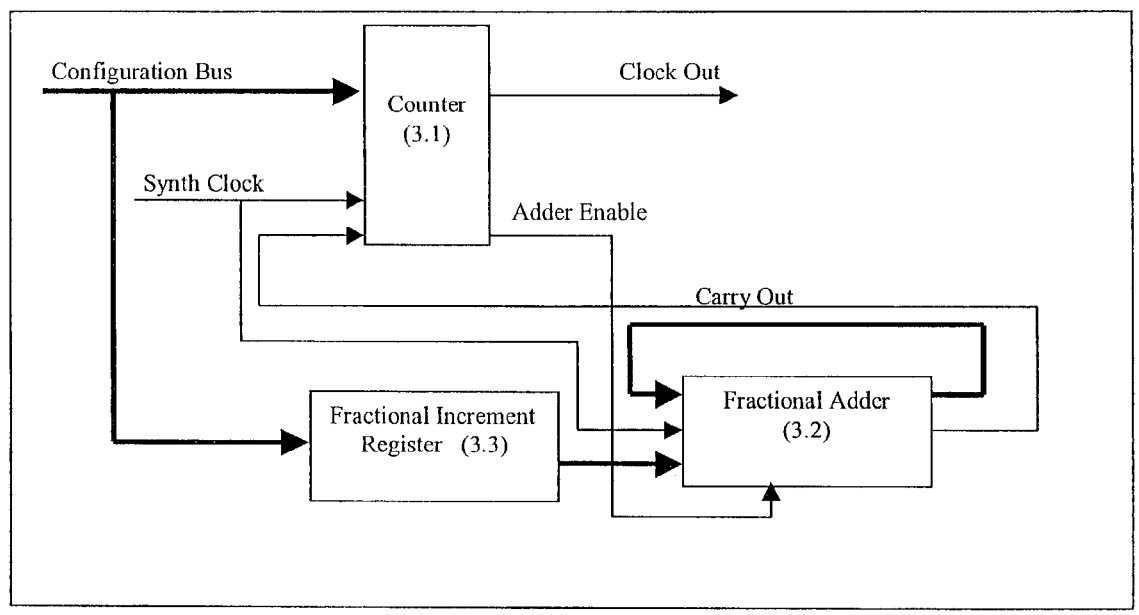
FIG. 3 shows the fractional divider (2.6) of FIG. 2 and its functioning, in accordance with an embodiment of the invention.

The fractional divider (2.6) is responsible for the clock recovery scheme. The fractional divider could be any known fractional divider. A preferred embodiment of the fractional divider is shown in FIG. 3 and is described in U.S. patent application Ser. No. 10/269,838 to Chakravarthy, which is entitled "An Improved Fractional Divider", and which was filed Oct. 10, 2002 and issued as U.S. Pat. No. 6,795,519, and which is incorporated herein by reference. The fractional divider (2.6) receives the digital error signal comprising an integer part and a fractional part on its configuration bus from the output of the comparator (2.3). The fractional divider (2.6) converts the error signal to the required frequency. The fractional divider (2.6) is clocked by a synthesizer (2.8), generating a high frequency clock (typically 600 MHz) with the help of a reference frequency from a crystal oscillator (2.7).

FIG. 3 shows the fractional divider (2.6) of FIG. 2, in accordance with an embodiment of the invention. The output from the synthesizer (2.8) of FIG. 2 is given to a counter (3.1) of the fractional divider (2.6), as shown FIG. 3. The counter can be configured to divide by either n or n+1 depending upon the logic-state of the carry out.

The fractional adder (3.2) is a binary adder. The fractional increment register (3.3) holds the fractional increment value. The contents of the fractional increment register are added to the current contents of the fractional adder when the clock enable is high and there is a rising Synth clock edge.

By way of example, to get 27 MHz clock, the reference frequency of 600 MHz from the synthesizer (2.8 of FIG. 2) has to be divided by 22.222222. To achieve this, the counter (3.1) is programmed as divide by 22. The fractional increment value register (3.3) is initialized with the fractional value viz., 0.222222. The counter (3.1) is arranged such that when it completes one programmed count, the clock out completes one clock cycle, simultaneously the contents of the fractional increment register (3.3) are added to the contents of fractional adder (3.2) once every clock out cycle. When an overflow in the fractional adder occurs, the carry out is set to logic '1'. This configures the counter as divide by 23. Table 1 shows the division factor and the fractional part in the fractional adder for every 27 MHz clock cycle generated.

TABLE 1

| S. No | Division Factor | Fractional Division |
|---|---|---|
| 1 | 22 | 0.2222222 |
| 2 | 22 | 0.4444444 |
| 3 | 22 | 0.6666666 |
| 4 | 22 | 0.8888888 |
| 5 | 23 | 0.1111111 |
| 6 | 22 | 0.3333333 |
| 7 | 22 | 0.5555556 |
| 8 | 22 | 0.7777778 |
| 9 | 23 | 0.0 |

The ratio of frequencies is 27:600=9:200. That implies the phases will match after 9 clocks of 27 MHz and 200 clocks of 600 MHz. The first column represents the number of clock cycles of the 27 MHz clock, the contents of the second column when added is 200, which is equal to the number of 600 MHz clocks. The division by a factor 'n' or 'n+1' is implemented by a programmable divider. The 'Fractional Adder is a 24-bit binary adder. The addition operation in the 'Fractional Adder' unit is performed when 'Adder Enable' is high and on a rising Synth clock edge. The 'Adder Enable' is high for only one Synth clock cycle. The 'Carry Out' signal is high only when there is a carry from the addition. The division logic is configured to divide by 'n' when carry out signal is low. It is configured to divide by 'n+1' when carry out signal is high.

This embodiment also relates to a method for enabling clock recovery from data streams (2.9) containing embedded reference clock values wherein a locally generated clock (2.10) is adjusted to match with the received embedded reference clock value, the adjustable local clock being generated by controlled fractional division (2.6) of the output of a fixed clock source.

What is claimed is:

1. An apparatus for clock recovery from incoming data streams containing embedded reference clock values, comprising:
   clock reference storage circuit for storing clock reference values received from the incoming data stream connected to,
   an output of said digital comparator, a second input of which is connected to,
   a local clock storage circuit for storing locally generated clock values provided by a,
   a counter which receives a clock signal from a controlled clock source circuit controlled by the output of said digital comparator,
   wherein said controlled clock source circuit consists of a controllable digital fractional divider receiving a control value from said digital comparator and a clock input from a digital clock synthesizer driven by a fixed oscillator, and wherein said digital fractional divider is a digitally implemented fractional divider for providing an output signal having a frequency that is a fraction of a frequency of an input clock signal, the divider comprising:
      a programmable counter to count to a value K equal to an integer part of the fraction denominator when a count-control signal has a first state, and count to a value K+1 when the count-control signal has a second state, and to generate the output signal and a terminal count signal that is a function of the count value; and
      a fractional accumulator to receive the terminal count signal, a feedback of the accumulator output, and a fractional part of the fraction denominator, and produce the count-control signal having the second state upon occurrence of an addition overflow.

2. The apparatus as claimed in claim 1, wherein a gain of the digital comparator is adjusted in accordance with changing its input conditions.

3. The apparatus as claimed in claim 2, wherein the gain of said digital comparator is adjusted to a high value prior to obtaining a match between said Local Clock and said Clock Reference and reduced after obtaining said match.

4. A method for enabling clock recovery from data streams containing embedded reference clock values, comprising the steps of:
   storing the received reference clock values;
   generating a controlled local clock by performing controlled fractional division on an output from a fixed clock source, the operation of controlled fractional division including,
      counting to a value K equal to an integer part of a fractional denominator when a count-control signal has a first state,
      counting to a value K+1 when the count-control signal has a second state, and
      generating an output signal and a terminal count signal that is a function of a value of the count,
      accumulating a fractional part N of the fractional denominator,
      responsive to the terminal count signal, the output from the fixed clock source, and the fractional part N of the fractional denominator, generating the count-control signal having the second state upon the occurrence of an addition overflow condition in the operation of accumulating;
   comparing said received reference clock with said generated controlled local clock;
      from the operation of comparing, generating a control value indicating the difference between the corresponding reference clock and the controlled local clock; and
   in response to the control value, adjusting said controlled local clock to match said received reference clock.

5. The method as claimed in claim 4, further including adjusting of loop gain in accordance with changing input conditions of the comparison.

6. The method as claimed in claim 5, wherein said loop gain is adjusted to a high value prior to lock-in and to a lower value after lock-in, where lock-in comprises obtaining a match between said controlled local clock and said reference clock.

* * * * *